United States Patent [19]
Iizuka et al.

[11] Patent Number: 6,013,112
[45] Date of Patent: Jan. 11, 2000

[54] RELAY APPARATUS FOR RELAYING OBJECT TO BE TREATED

[75] Inventors: Yoji Iizuka, Tokyo; Teruo Asakawa, Yamanashi-ken, both of Japan

[73] Assignee: Tokyo Electron Limited, Tokyo, Japan

[21] Appl. No.: 08/927,563

[22] Filed: Sep. 9, 1997

[30] Foreign Application Priority Data

Sep. 9, 1996 [JP] Japan ................................. 8-260347

[51] Int. Cl.[7] .................................................. H01L 21/68
[52] U.S. Cl. ............................................................ 29/25.01
[58] Field of Search .................................. 206/711, 710, 206/712, 833; 211/41, 18; 414/936, 937, 938; 29/215.01; 438/FOR 436

[56] References Cited

U.S. PATENT DOCUMENTS

| | | |
|---|---|---|
| 4,493,606 | 1/1985 | Foulke et al. . |
| 4,744,715 | 5/1988 | Kawabata . |
| 4,952,115 | 8/1990 | Ohkase . |
| 5,054,418 | 10/1991 | Thompson et al. . |
| 5,125,784 | 6/1992 | Asano . |
| 5,266,812 | 11/1993 | Mokuo . |
| 5,452,795 | 9/1995 | Gallagher et al. . |
| 5,533,243 | 7/1996 | Asano . |
| 5,609,459 | 3/1997 | Muka . |
| 5,613,821 | 3/1997 | Muka et al. . |
| 5,664,337 | 9/1997 | Davis et al. . |

FOREIGN PATENT DOCUMENTS

| | | |
|---|---|---|
| 1-251734 | 10/1989 | Japan . |
| 3-241853 | 10/1991 | Japan . |

*Primary Examiner*—David E. Graybill
*Attorney, Agent, or Firm*—Graham & James LLP

[57] ABSTRACT

A relay apparatus according to the invention is provided for transferring to-be-treated objects between a transfer mechanism for carrying the objects into and out of a treatment chamber, and a cassette containing the objects. The relay apparatus comprises a transfer unit including holding portions for each holding a corresponding one of the objects from below, the transfer unit transferring the objects between the cassette and a transfer position at which the objects are transferred to the transfer mechanism, while holding the object with the holding portions, and a stopper located in the transfer position for adjusting positions of edge portions of all the objects held by the holding portions of the transfer means, thereby preventing the objects from moving horizontally relative to the holding portions.

8 Claims, 7 Drawing Sheets

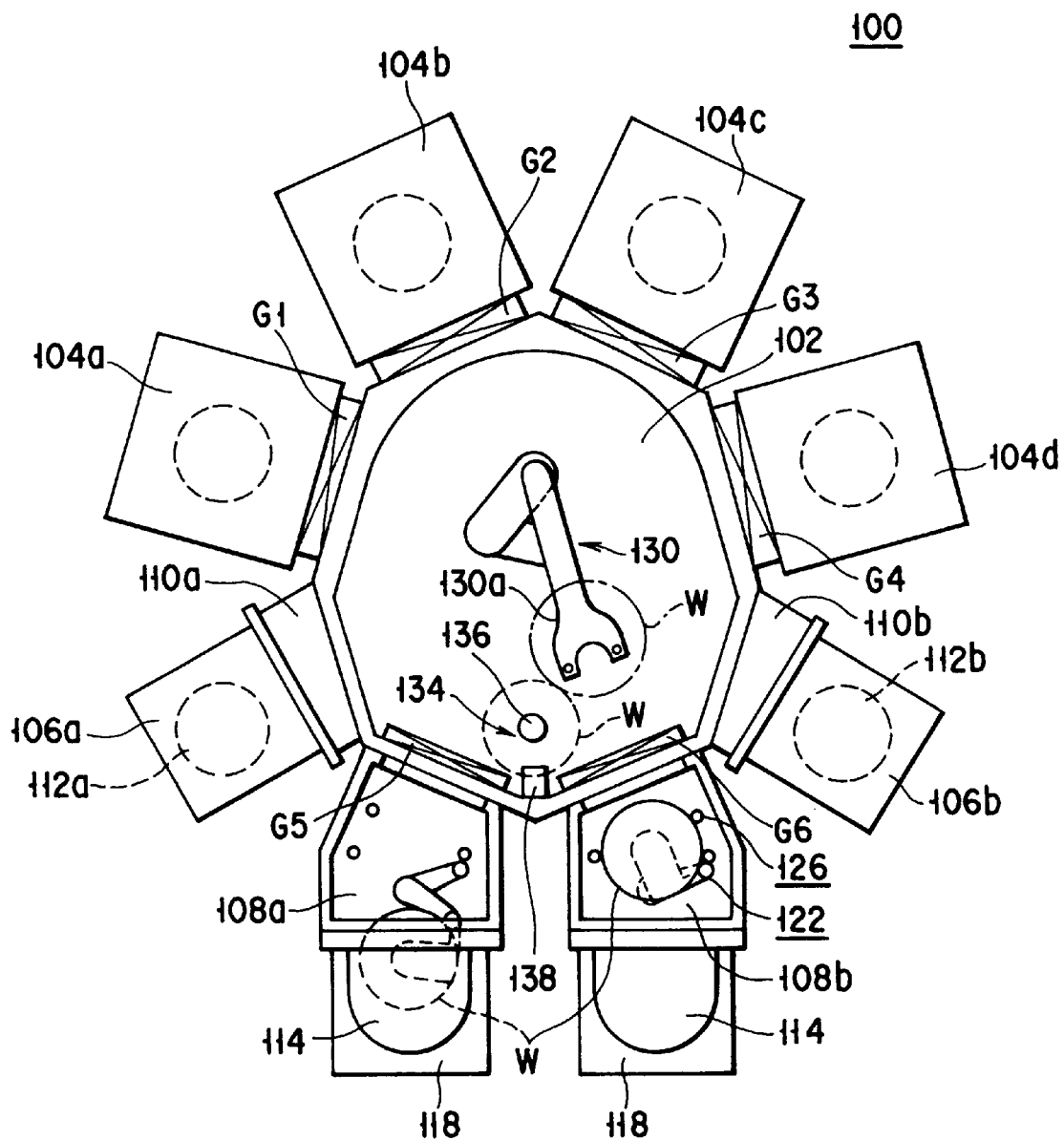
F I G. 1

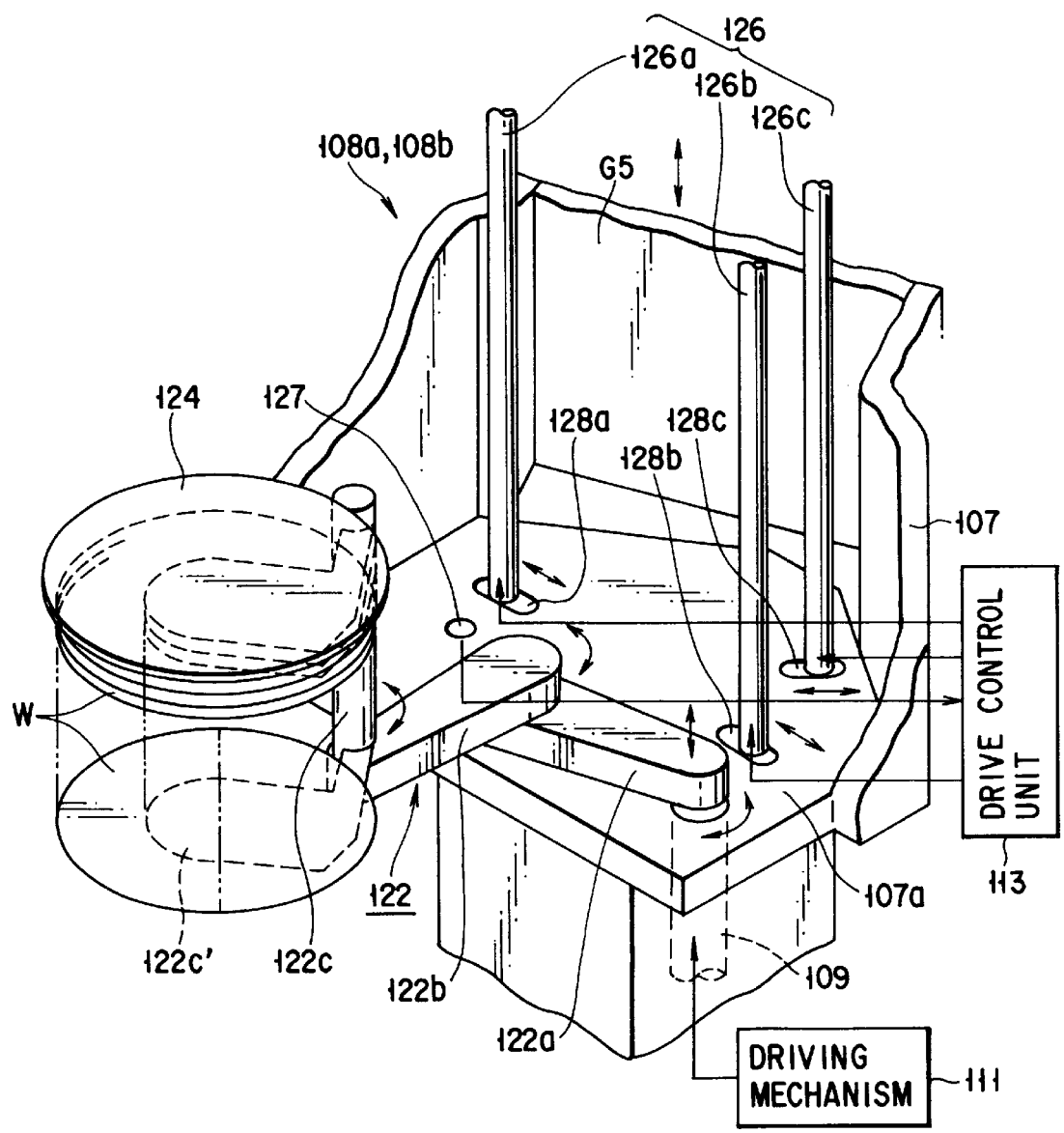
F I G. 3

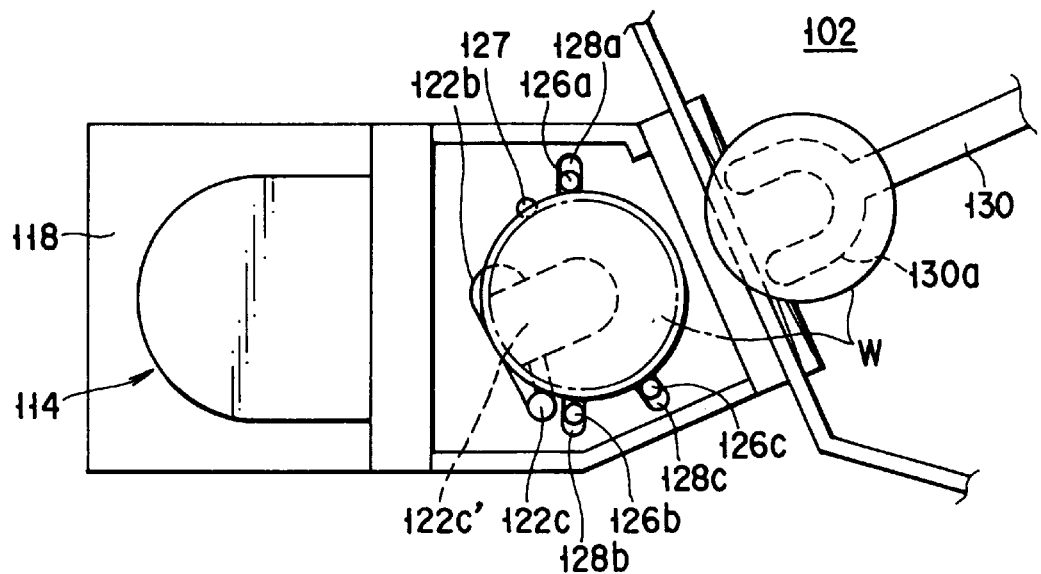
F I G. 7
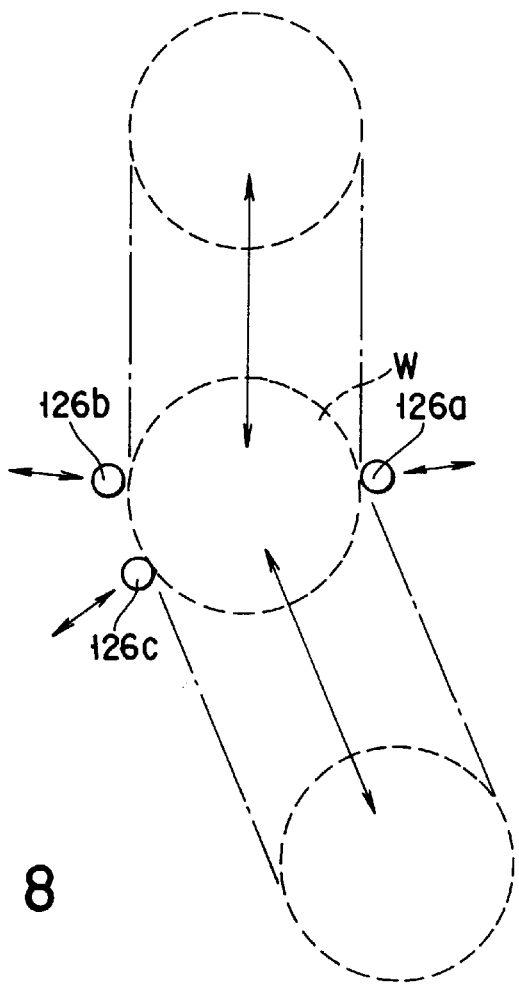
F I G. 8 ured by the transfer arm. At the time of using the cluster tool, a cassette which stores a plurality of to-be-treated objects is set in a cassette chamber, and one or more of the objects stored in the cassette set in the cassette chamber are transferred therefrom to the common transfer chamber. Then, the objects are subjected to positional alignment performed by a pre-alignment unit located in the common transfer chamber, and transferred to a predetermined vacuum treatment chamber by the transfer arm. In the vacuum treatment chamber, the objects are subjected to an etching treatment, a sputtering treatment, a CVD treatment, etc. The thus treated objects are transferred out of the vacuum chamber by the transfer arm and returned, via the common transfer chamber, to the cassette in the cassette chamber.

RELAY APPARATUS FOR RELAYING OBJECT TO BE TREATED

BACKGROUND OF THE INVENTION

This invention relates to a relay apparatus for relaying a to-be-treated object between a transfer arm for transferring the object to and from a treatment chamber, and a cassette for storing the object.

In a semiconductor manufacturing process these days, a multi-chamber treatment apparatus, a so-called cluster tool, is used which is constituted of a common transfer chamber and various chambers (such as vacuum treatment chambers, a cassette chamber, etc.) situated around the common transfer chamber and connected thereto. At the time of using the cluster tool, a cassette which stores a plurality of to-be-treated objects is set in a cassette chamber, and one or more of the objects stored in the cassette set in the cassette chamber are transferred therefrom to the common transfer chamber. Then, the objects are subjected to positional alignment performed by a pre-alignment unit located in the common transfer chamber, and transferred to a predetermined vacuum treatment chamber by the transfer arm. In the vacuum treatment chamber, the objects are subjected to an etching treatment, a sputtering treatment, a CVD treatment, etc. The thus treated objects are transferred out of the vacuum chamber by the transfer arm and returned, via the common transfer chamber, to the cassette in the cassette chamber.

In a case where the cassette is of a so-called open type, the cassette chamber is necessary to isolate the objects from the outside. However, in a case where the cassette is of a so-called sealed type, the cassette chamber is not always necessary since the cassette itself can isolate the objects. In the latter case, where the cassette chamber is not used, the sealed type cassette is connected, directly or via a relay chamber, to the common transfer chamber.

Where the sealed type cassette is connected to the common transfer chamber via the relay chamber, to-be-treated objects stored in the cassette are transferred to the relay chamber by transfer means. In the relay chamber, the objects are shifted from the transfer means to the transfer arm. Then, the objects are transferred to the common transfer chamber by the transfer arm. At the time of shifting the objects, in particular, simultaneously, from the transfer means to the transfer arm, the objects may well move from a predetermined position on the transfer means or arm, or fall therefrom because of the vibration of the transfer means or arm, or because of the vibration of a gate valve located between the relay chamber and the common transfer chambers, which will occur at the time of opening or closing the valve. Moreover, also when the transfer of the objects between the transfer means and the transfer arm is interrupted for some reason, they may well move or fall. In addition, if there is a pressure difference between the common transfer chamber and the relay chamber, a turbulence will occur when the gate valve provided between the common transfer chamber and the relay chamber for isolating them from each other is opened, which may cause the movement or fall of the objects.

Furthermore, at the time of transferring the objects between the cassette and the relay chamber or between the transfer means and the transfer arm, dust particles may rise and stick to the objects since the relay chamber is shifted between a vacuum pressure and the atmospheric pressure. The same can be said of the case where the objects are temporarily put in the relay chamber before they are transferred from the transfer means to the transfer arm. Therefore, while the objects are transferred, it is necessary to take measure so that no dust or impurity will stick to to-be-treated surfaces of the objects.

BRIEF SUMMARY OF THE INVENTION

It is the object of the invention to provide a relay apparatus capable of preventing the movement of to-be-treated objects on a transfer arm or the fall of the objects therefrom, and transferring the objects between the transfer arm and a cassette, with to-be-treated surfaces of the objects kept clean.

To attain the object, there is provided a relay apparatus for transferring to-be-treated objects between a transfer mechanism for carrying the objects into and out of a treatment chamber, and a cassette containing the objects, comprising: transfer means including holding portions for each holding a corresponding one of the objects from below, the transfer means transferring the objects between the transfer mechanism and the cassette in a transfer position, while holding the object with the holding portions; and stopper means located in the transfer position for holding edge portions of all the objects held by the holding portions of the transfer means, thereby preventing the objects from moving horizontally relative to the holding portions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a schematic plan view, showing a cluster tool having relay units according to the embodiment of the invention;

FIG. 3 is a perspective view, showing the relay unit according to the embodiment of the invention;

FIG. 7 is a plan view, useful in explaining an operation of the relay unit of FIG. 3;

FIG. 8 is a plan view, showing a wafer transfer path with a wafer transfer position as its center;

DETAILED DESCRIPTION OF THE INVENTION

Figure 2:
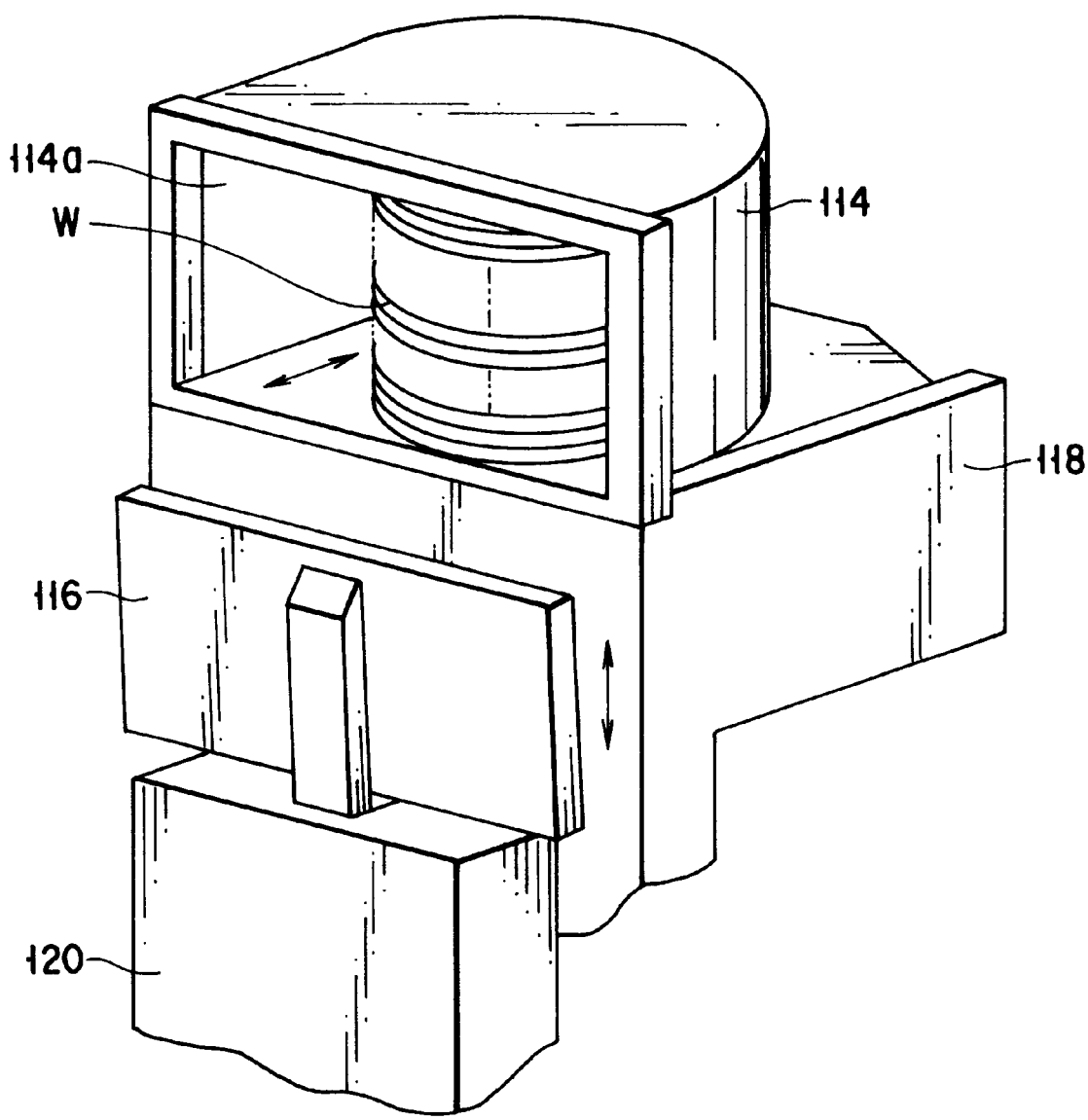
FIG. 2 is a perspective view, showing a sealed type cassette located close to each relay chamber of the relay units.

The embodiments of the invention will be described with reference to the accompanying drawings.

FIG. 1 shows a cluster tool 100 for continuously performing predetermined treatments of semiconductor wafers W (to-be-treated objects) with a size of e.g. 12 inches. As is shown in FIG. 1, the cluster tool 100 has a common transfer chamber 102 at a substantially center portion thereof. First through fourth vacuum treatment chambers 104a–104d, two preliminary vacuum chambers 106a and 106b and two relay chambers 108a and 108b are arranged around the common transfer chamber 102. The four vacuum chambers 104a–104d are connected to the common transfer chamber 102 via gate valves G1–G4, respectively, so that they can communicate with the common transfer chamber 102. The two preliminary vacuum chambers 106a and 106b communicate with the common transfer chamber 102 via communication passages 110a and 110b, respectively. The relay chambers 108a and 108b are connected to the common transfer chamber 102 via gate valves G5 and G6, respectively, so that they can communicate with the common transfer chamber 102.

The common transfer chamber 102 contains a transfer arm 130 for transferring the wafers W to the chambers 104a–104d, 106a, 106b, 108a and 108b. The transfer arm 130 is formed of an articulated arm made of e.g. aluminum, and has horizontally driven arm portions. The transfer arm 130 has its distal end disposed to serve as a wafer mount table 130a for mounting a wafer W thereon. The common transfer chamber 102 also contains a positioning unit 134 for positioning each wafer W so that it can be accurately transferred to a treatment position in each of the vacuum chambers 104a–104d and subjected to a uniform treatment therein. The positioning unit 134 comprises a rotary mount table 136 and an optical detector means 138 having a light emitting element and a light receiving element.

In the first vacuum chamber 104a, a through hole is formed, by plasma etching, in a wafer W, more specifically, in an interlayer insulating film made of silicon oxide and provided on a silicon substrate. In the remaining vacuum chambers 104b, 104c and 104d, the through hole is filled with a titanium film, a titanium nitride film and a tungsten film, which are formed in this order and serve as a wiring layer. More specifically, in the second vacuum chamber 104b, a titanium film as an Ohmic contact film and a titanium nitride film as a barrier film are formed in the through hole by sputtering. In the third vacuum chamber 104c, a tungsten film is formed on the barrier film by CVD. In the fourth vacuum chamber 104d, the tungsten film is etched back by plasma etching. It is a matter of course that the treatments performed in the vacuum chambers 104a–104d are not limited to the above but may be changed in accordance with purposes.

Mount tables 112a and 112b are provided in the preliminary vacuum chambers 106a and 106b, respectively. The mount tables 112a and 112b each have heating means and cooling means mounted thereon for heating and cooling a wafer W placed thereon, respectively, if necessary.

A sealed type cassette 114 is detachably connected to each of the relay chambers 108a and 108b. As is shown in FIG. 2, the cassette 114 comprises a substantially semi-cylindrical container capable of containing a plurality (e.g. 25) of 12-inch wafers W. This container is made of, for example, aluminum. The container 114 has a wafer take-in/take-out port 114a to be opened and closed with a detachable plate 116. The container is sealed in an substantially airtight manner when the port 114a is closed with the plate 116.

The cassette 114 is placed on each of cassette mount tables 118 connected to the relay chambers 108a and 108b, respectively. When the cassette 114 is placed on the cassette mount table 118 by means of cassette transfer means (not shown), a predetermined portion of the plate 116 of the cassette 114 is engaged with an opening/closing mechanism 120 incorporated in each of the relay chambers 108a and 108b. When the opening/closing mechanism 120 is driven in this state, the plate 116 is moved downward, and the wafer take-in/take-out port 114a opens to the relay chamber 108a or 108b.

Referring then to FIG. 3, the relay chambers 108a and 108b each comprise a container 107 made of, for example, aluminum and capable of containing a plurality (e.g. 25) of wafers W. The container 107 contains a relay unit comprising a transfer arm 122 as transfer means and three bars 126a–126c as stopper means 126.

The transfer arm 122 is an articulated arm made of e.g. aluminum and having first and second horizontal arm portions 122a and 122b. The first horizontal arm 122a is fixed to a driving shaft 109 vertically extending from the bottom 107a of the container 107 through the container 107. The driving shaft 109 is coupled with a driving mechanism 111 such that it can move angularly and vertically. The second horizontal arm portion 122b has an end coupled with a driving mechanism (not shown) provided on the first horizontal arm portion 122a, and is horizontally rotatable table relative to the first horizontal arm portion 122a. The other end of the second horizontal arm portion 122b is coupled with a wafer support shaft 122c extending upward and vertical. The wafer support shaft 122c is coupled with a driving mechanism (not shown) provided on the second horizontal arm portion 122b, such that it can rotate.

A plurality (e.g. 25) of mount plates 122c' each for mounting a wafer W thereon are fixed to the wafer support shaft 122c in its longitudinal direction. The mount plates 122c' are arranged at regular intervals and each have a size smaller than the outer diameter of the wafer W. To prevent an impurity from sticking to to-be-treated surfaces of the wafers W mounted on the mount plates 122c', a circular top plate 124 having a larger outer diameter than the wafer W is fixed to an uppermost portion of the wafer support shaft 122c parallel to the mount plates 122c'.

The three bars 126a–126c are provided in a wafer transfer position in each of the relay chambers 108a and 108b such that they will not interfere the movement of the transfer arms 122 and 130. The three bars 126a–126c are made of e.g. aluminum or ceramic, and extend upward and vertical from the bottom 107a of the container 107. Further, these bars are arranged at regular intervals so that they can hold, in the wafer transfer position, edge portions of the wafers W on the transfer arm 122 or 130, and prevent the wafers from radially moving thereon and falling therefrom. In particular, in the embodiment, the three bars 126a–126c are positioned such that the transfer arms 122 and 130 will not interfere with each other at the time of transfer the wafer therebetween. Specifically, as is clearly shown in FIG. 8, the three bars 126a–126c are arranged so that a predetermined angle can be formed between the locus of the center of the wafer W transferred to the wafer transfer position by the transfer arm 122, and the locus of the center of the wafer W transferred to the wafer transfer position by the transfer arm 130.

The bars 126a–126c have their lower ends engaged with three elongated grooves 128a–128c formed in the bottom 107a of the container 107, respectively, such that they can be individually and horizontally moved along the grooves by a drive control unit 113. An optical sensor 127 is provided on the bottom 107a of the container 107 for sensing the mount states of the wafers W on the transfer arm 122 (i.e. on the mount plates 122c'). Sensor data from the optical sensor 127 is supplied to the drive control unit 113, which, in turn, individually and horizontally move the bars 126a–126c on the basis of the sensor data, thereby adjusting the positions of the bars so that they can reliably hold edge portions of the wafers W on the transfer arm 122.

A description will now be given of the process of transferring the wafers W in the cassette 114 to the vacuum treatment chambers 104a–104d, using the relay unit constructed as above, and subjecting them to predetermined treatments therein.

As is shown in FIG. 2, the cassette 114 contains, for example, 25 to-be-treated wafers W arranged vertical at regular intervals. To subject the wafers to a predetermined treatment, the cassette 114 is mounted, by means of cassette transfer means (not shown), onto the cassette mount table 118 located adjacent to the relay chamber 108a, and thus closely attached to the chamber. In this state, a predetermined portion of the plate 116 is engaged with the opening/closing mechanism 120 located in the relay chamber 108a. When the opening/closing mechanism 120 is operated, the plate 116 moves and the wafer transfer port 114a of the cassette 114 opens to the relay chamber 108a. At this time, the gate valve G5 interposed between the relay chamber 108a and the common transfer chamber 102 is closed. Further, the relay chamber 108a is airtightly sealed from the outside.

Figure 5:
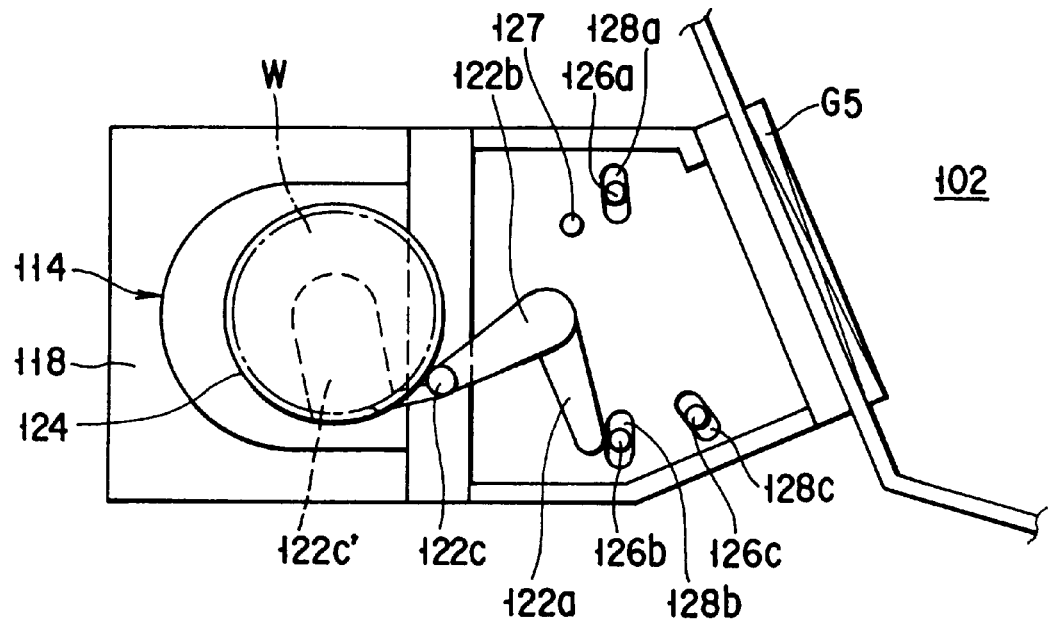
FIG. 5 is a plan view, useful in explaining an operation of the relay unit of FIG. 3.

Subsequently, the transfer arm 122 located in the relay chamber 108a is driven (specifically, the first horizontal arm portion 122a is rotated vertically and horizontally, while the second horizontal arm portion 122b is rotated horizontally relative to the first arm portion 122a), whereby each mount table 122c' of the transfer arm 122 is inserted between corresponding adjacent ones of the wafers W contained in the cassette 114, as is shown in FIG. 5. At this time, the top plate 124 is positioned to cover, from above, the to-be-treated surface of an uppermost wafer. Then, the transfer arm 122 is raised by a predetermined amount (specifically, the first horizontal arm portion 122a is raised), and each mount table 122c' mounts thereon a corresponding wafer W. Subsequently, each wafer W mounted on a corresponding mount table 122c' is carried to the wafer transfer position (see FIG. 3) defined in the relay chamber 108a by the bars 126a–126c. While the wafer W is being carried, the mount states of the wafers W on the mount tables 122c' of the transfer arm 122 are sensed by the optical sensor 127. In response to sense data, the control unit 113 adjusts, if necessary, the horizontal position of each of the bars 126a–126c so that edge portions of the wafers on the transfer arm 122 can reliably be held by the bars 126a–126c.

Figure 4:
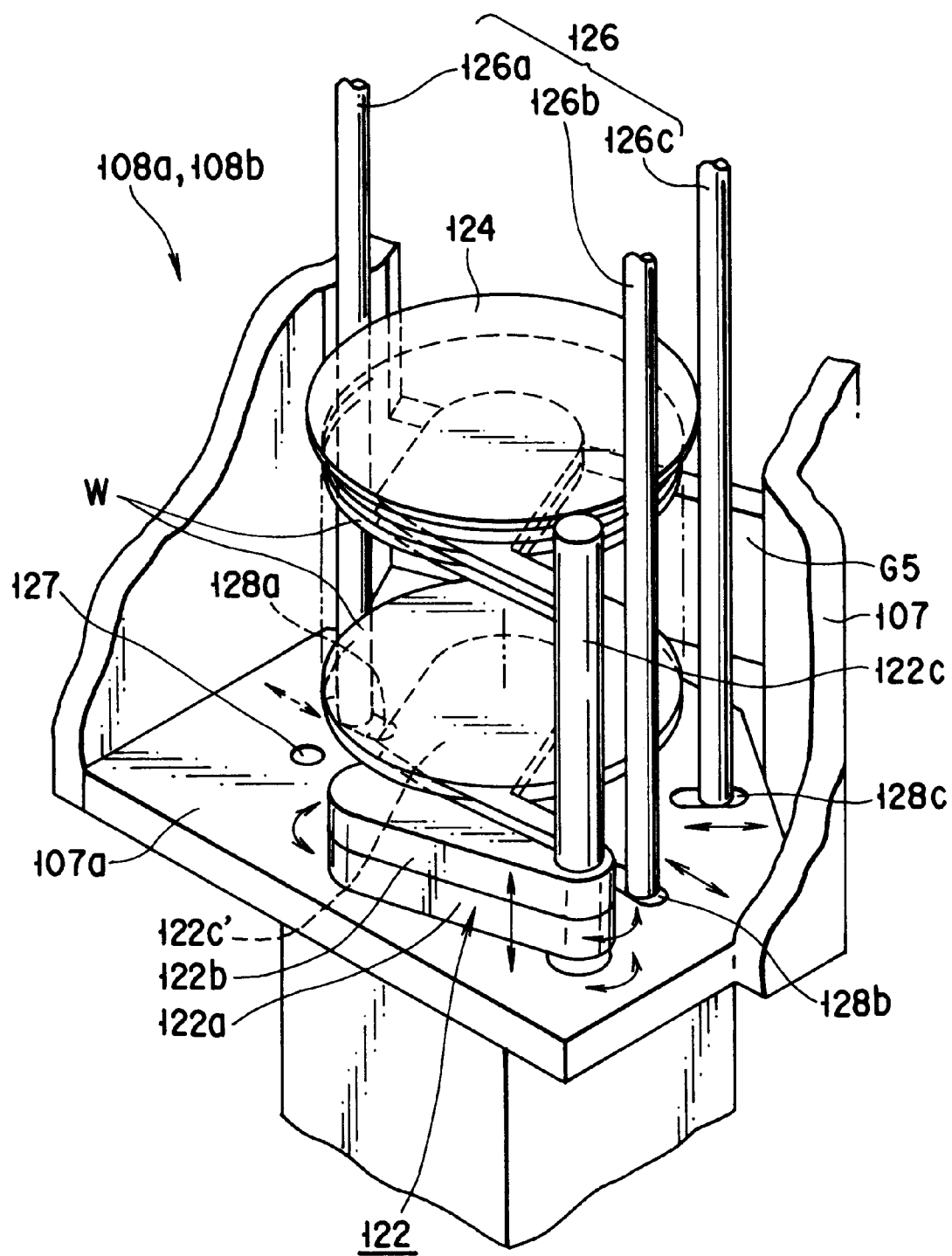
FIG. 4 is a perspective view, useful in explaining an operation of the relay unit of FIG. 3.
Figure 6:
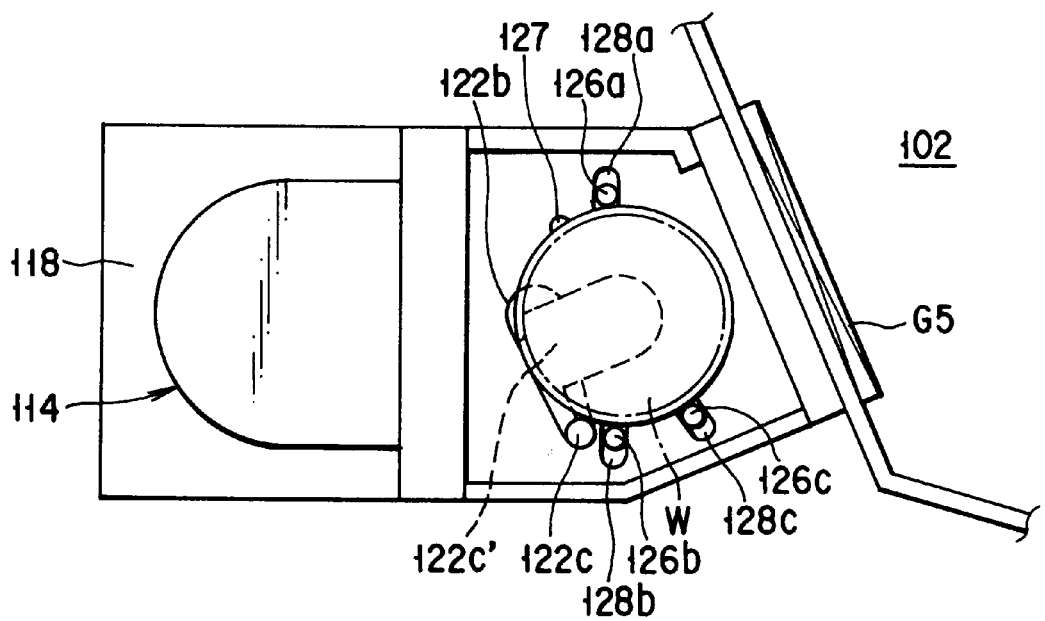
FIG. 6 is a plan view, useful in explaining an operation of the relay unit of FIG. 3.

Thus, each wafer W carried to the wafer transfer position together with the transfer arm 122 has edge portions thereof reliably held by the bars 126a–126c, and hence is prevented from radially moving on the arm or falling therefrom, as is shown in FIGS. 4 and 6. With the wafers W reliably held by the bars, the pressure in the relay chamber 108a is reduced, by gas supply/discharge means (not shown), to a vacuum value substantially identical to the pressure in the common transfer chamber 102. When the pressure in the relay chamber 108a is substantially identical to that in the common transfer chamber 102, the gate valve G5 is opened. Even if a turbulence occurs, the wafers W on the transfer arm 122 will not move or fall since the edge of each wafer is supported at three points by the bars 126a–126c. Moreover, even if dust particles will rise in the relay chamber 108a at the time of reducing the pressure therein to a vacuum value, no particles will stick to the to-be-treated surface of each wafer W since the top plate 124 covers it.

When the gate valve G5 is opened, the transfer arm 130 in the common transfer chamber 102 is driven, and the wafer mount table 130a of the transfer arm 130 is carried to the wafer transfer position in the relay chamber 108a. Then, the wafer mount table 130 is positioned below the predetermined one of the wafers W which is mounted on a corresponding one of the mount tables 122c'. At this time, the transfer arm 122 is lowered by a predetermined amount (specifically, the first horizontal arm portion 122a is lowered), with the result that the predetermined wafer is planed on the wafer mount table 130a. Thereafter, the wafer is transferred from the wafer transfer position to the common transfer chamber 102 by the transfer arm 130 (see FIG. 7). Since in the embodiment, the transfer arm 130 cannot be moved vertically, it is necessary to vertically move the transfer arm 122 and accordingly each wafer, at the time of sequentially transferring, to the transfer arm 130, a plurality of wafers W vertically arranged in the wafer transfer position. If the transfer arm 130 is modified to be vertically movable, it is, of course, not necessary to vertically move the transfer arm 122 at the time of transfer of a wafer.

The wafer W transferred to the common transfer chamber 102 is mounted on the rotary mount table 136 of the positioning unit 134 (see FIG. 1). When the wafer is mounted on the rotary mount table 136, the table 136 is rotated. While the table is rotated with the wafer mounted thereon, information concerning the edge configuration of the wafer W is obtained by the detector means 138, and the wafer is directed in a predetermined direction (positioned) by means of the table 136 on the basis of the information. To obtain information concerning the edge configuration of the wafer W, light is emitted from the light emitting element of the detector means 138. The portion of the light which is not shaded by an edge portion of the rotating wafer W is detected by the light receiving element of the detector means.

The wafer W positioned by the positioning unit 134 is mounted on the mount table 112a in the first preliminary vacuum chamber 106a or on the mount table 112b in the second preliminary vacuum chamber 106b, where the wafer is adjusted to a predetermined temperature. Then, the wafer W is carried out of the preliminary vacuum chamber again by means of the transfer arm 130, and sequentially carried into the first through fourth vacuum chambers 104a–104d via the gate valves G6–G9, respectively. Thus, the wafer W is sequentially subjected to the aforementioned predetermined treatments.

The wafer W treated in the first through fourth vacuum chambers 104a–104d has its temperature again adjusted to a predetermined value in the first or second preliminary vacuum chamber 106a or 106b, and is then returned to the relay chamber 108a by means of the transfer arm 130. In the relay chamber, the wafer is shifted from the transfer arm 130 to the transfer arm 122 kept in the wafer transfer position. The above-described process steps are repeated to treat all the remaining wafers.

As described above, in the relay unit of the invention, the three bars 126a–126c enable edge portions of the wafers W on the transfer arm 122 or 130 to be reliably supported in the wafer transfer position, thereby preventing the wafers W from radially moving on the arm 120 or 130 or from falling therefrom in the wafer transfer position.

Further, in the relay unit of the invention, the three bars 126a–126c are located such that they will not interfere with the transfer arms 122 and 130 and the transfer arms will not interfere with each other at the time of transferring each wafer therebetween, and can be individually moved in a horizontal direction to reliably hold edge portions of the wafers W. Accordingly, the wafers W can be transferred reliably and efficiently.

In addition, in the relay unit of the invention, the transfer arm 122 has the top plate 124 for preventing an impurity from sticking to the wafers W. Accordingly, dust particles which rise in the relay chamber 108a or 108b are prevented from sticking to the to-be-treated surface of each wafer W.

Although in the embodiment, three bars are used as stopper means, the number of bars may be set to a voluntary value if they can reliably hold the wafers W in the wafer transfer position. Although the bars 126a, 126b and 126c of the stopper means are horizontally movable along the grooves 128a, 128b and 128c, these bars may be made immovable. In addition, there may be small gaps between the bars 126a, 126b and 126c and the edge portions of the wafers W if displacement or fall of the wafers W can be prevented. Further, although in the embodiment, the wafers W are transferred one by one from the transfer arm 122 to the transfer arm 130, they may be transferred at a time. Moreover, although the sealed type cassette is used to contain the wafers W, an open type cassette may be used in place of the former. In addition, although the semiconductor wafers W are used as objects to be treated, LCD glass substrates, etc. may be used instead.

Figure 9:
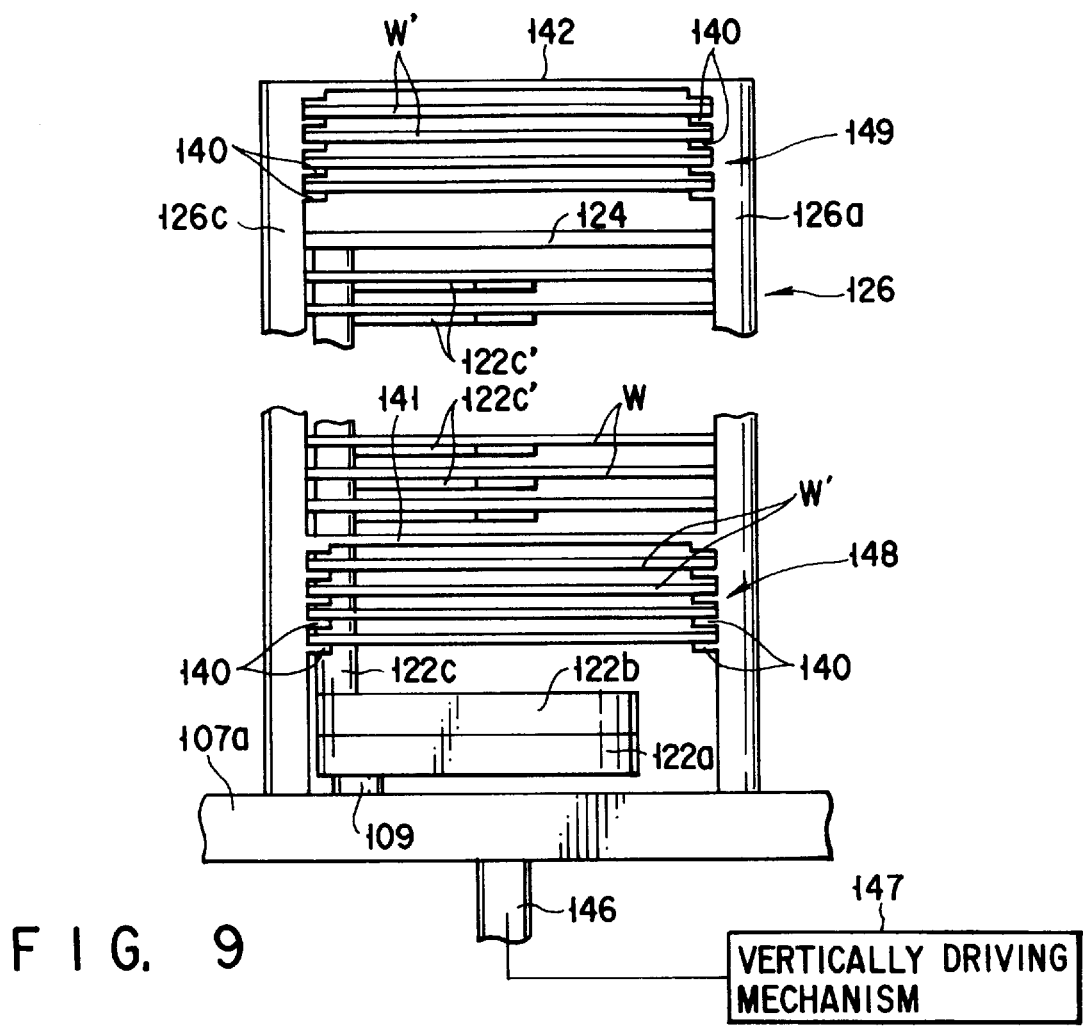
FIG. 9 is a side view, showing a first modification of the relay unit of FIG. 3.

FIG. 9 shows a first modification of the above-described embodiment. As is shown in FIG. 9, the upper and lower portions of the stopper means 126, which are located not to interfere with the wafers W held by the transfer arm 122, are used as dummy wafer stocker portions 148 and 149. Each of the stocker portions 148 and 149 has support chips 140 projecting from the bars 126a–126c (the bar 126b is omitted in FIG. 9) for supporting dummy wafers W' individually. Top plates 141 and 142 are provided above the dummy wafer stocker portions 148 and 149, respectively, thereby separating the dummy wafer stocker portions themselves from the wafers W held by the transfer arm 122, and preventing an impurity from sticking to the dummy wafers W' and the to-be-treated wafers W. It is a matter of course that each of the dummy wafer stocker portions 148 and 149 may be provided at one of a lower portion and an upper portion of the stopper means 126. Moreover, the bottom 107a of the container 107 which defines the relay chamber 108a is coupled with a vertically driven shaft 146 driven by a vertically driving mechanism 147. Accordingly, when the vertically driven shaft 146 is raised, the transfer arm 122 and the bars 126a–126c are raised together.

If in this structure, only the transfer arm 122 is vertically driven at the time of sequentially transferring, to the transfer arm 130, the wafers W vertically arranged in the wafer transfer position, the transfer arm 122 interferes with the dummy wafer stocker portions 148 and 149. To avoid this, the vertically driven shaft 146 is raised at the time of transfer the wafers W to the transfer arm 130, thereby raising the transfer arm 122 and the bars 126a–126c together. As a result, the wafers W are vertically moved.

Figure 10:
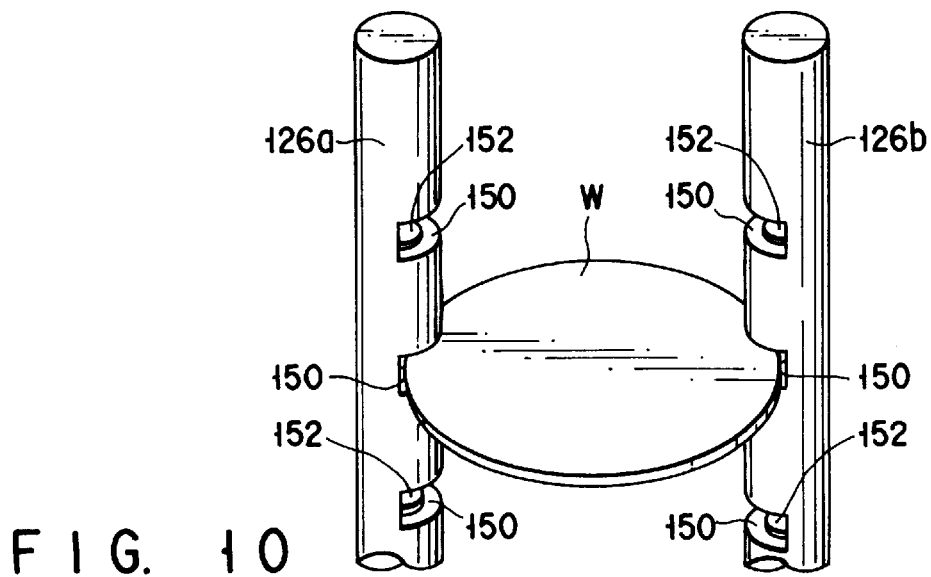
FIG. 10 is a perspective view, showing an essential part of a second modification of the relay unit of FIG. 3.

FIG. 10 shows a second modification of the embodiment. As is shown in FIG. 10, each of the bars 126a–126c (the bar 126c is omitted therein) has a plurality of grooves 150 arranged in the longitudinal direction at regular intervals for individually supporting edge portions of the wafers W transferred by the transfer arm 122. An elastic member 152 of a low friction coefficient is fixed to the inner surface of each of the grooves 150, which is to be brought into contact with an edge portion of each wafer W, in order to minimize the friction between the wafer and the inner surface. The elastic member 152 is formed of, for example, CALREZ (product name)(Formal Name: Per-fluoro elastomer).

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A relay apparatus for transferring a plurality of to-be-treated objects contained in a cassette to a mount table of a transfer arm that is provided inside a treatment apparatus, said relay apparatus comprising:

a relay chamber connected to the treatment apparatus and constituting a container having a space for containing the plurality of objects;

a carrying arm having a support shaft that extends in a direction perpendicular to a bottom surface of the container of the relay chamber, and also having a plurality of mount plates that are fixed to the support shaft and include mount surfaces on which the objects are laid, said carrying arm being arranged movably inside the relay chamber and carrying the plurality of objects in said cassette to a transfer position located inside the relay chamber; and a stopper constituting a plurality of bars that are located at the transfer position, said plurality of bars extend in a direction perpendicular to the bottom surface of the container of the relay chamber and are arranged so as to allow the mount plates of the carrying arm to pass through under a condition where the mount plates are holding the objects, said stopper preventing the objects from being misaligned in a horizontal direction with respect to the mount plates by bringing the edge portions of the objects that are mounted on the mount plates at the transfer position into contact with the bars.

2. The relay apparatus according to claim 1, wherein the plurality of bars are arranged so that said bars can move individually in a horizontal direction parallel to the bottom surface of the container of the relay chamber.

3. The relay apparatus according to claim 2, further comprising a sensor for detecting a mounting state of the objects being positioned on the mount plates of the carrying arm, and a drive control mechanism connected to each of the bars for causing the bars to move individually in a horizontal direction.

4. The relay apparatus according to claim 3, wherein the drive control mechanism moves the bars in accordance with detection information from said sensor and adjusts the position of each of the bars so that the edge of the objects positioned on the mount plates of the carrying arm are in contact with each of the bars.

5. The relay apparatus according to claim 4, wherein each of the bars is provided with a plurality of grooves.

6. The relay apparatus according to claim 5, wherein each of the bars supports the edge of each of the objects by use of the grooves and thereby holds each of the objects individually.

7. The relay apparatus according to claim 1, wherein the support shaft of the carrying arm includes a cover plate arranged so as to cover an uppermost mount plate from a top side.

8. The relay apparatus according to claim 1, wherein the stopper includes a storage section for stocking a dummy object, said storage section being arranged at such a position so as to avoid obstructing the objects mounted on the mount plates of the carrying arm.

\* \* \* \* \*